United States Patent
Banet et al.

(10) Patent No.: US 11,824,328 B2
(45) Date of Patent: Nov. 21, 2023

(54) MAINTENANCE DRAWER FOR AN ELECTRICAL DISTRIBUTION SWITCHBOARD

(71) Applicant: Electricite de France, Paris (FR)

(72) Inventors: Laurent Banet, Lyons (FR); Antoine Galasso, Lyons (FR); Jean-Yves Richard Mounier, Cruas (FR)

(73) Assignee: Electricite de France

( * ) Notice: Subject to any disclaimer, the term of this patent is extended or adjusted under 35 U.S.C. 154(b) by 51 days.

(21) Appl. No.: 17/621,539

(22) PCT Filed: Jun. 24, 2020

(86) PCT No.: PCT/FR2020/051105
§ 371 (c)(1),
(2) Date: Dec. 21, 2021

(87) PCT Pub. No.: WO2020/260828
PCT Pub. Date: Dec. 30, 2020

(65) Prior Publication Data
US 2022/0360055 A1  Nov. 10, 2022

(30) Foreign Application Priority Data

Jun. 26, 2019  (FR) ...................................... 1906977

(51) Int. Cl.
| | |
|---|---|
| *H02B 1/36* | (2006.01) |
| *H02B 3/00* | (2006.01) |
| *G01R 19/155* | (2006.01) |

(52) U.S. Cl.
CPC ............. *H02B 1/36* (2013.01); *G01R 19/155* (2013.01); *H02B 3/00* (2013.01)

(58) Field of Classification Search
CPC ....................................................... H02B 1/36
See application file for complete search history.

(56) References Cited

U.S. PATENT DOCUMENTS

| | | | |
|---|---|---|---|
| 8,199,022 B2 * | 6/2012 | Morris ..................... | H02B 1/36 340/648 |
| 9,634,469 B2 * | 4/2017 | Frye ....................... | H02B 13/00 |
| 10,094,858 B1 * | 10/2018 | Lahowetz .......... | G01R 19/0084 |
| 2008/0258667 A1 | 10/2008 | Morris et al. | |

FOREIGN PATENT DOCUMENTS

WO     2010122765 A1    10/2010

OTHER PUBLICATIONS

International Search Report for PCT/FR2020/051105 dated Aug. 24, 2020. 2 pgs.

* cited by examiner

*Primary Examiner* — Robert J Hoffberg
(74) *Attorney, Agent, or Firm* — Lerner David LLP

(57) ABSTRACT

A drawer comprising a chassis configured for insertion into an opening in a distribution switchboard, a front facade that closes the opening in the distribution switchboard when the drawer is inserted, and downstream connection terminals intended to be connected to a load, wherein the distribution drawer includes a plurality of connectors that open onto its front facade, each of these connectors being connected to a downstream connection terminal and allowing a measurement apparatus to be connected, and the connection drawer including a selector that is actuatable from the front facade and that allows the downstream connection terminals to be connected to and disconnected from an equipotential link.

12 Claims, 5 Drawing Sheets

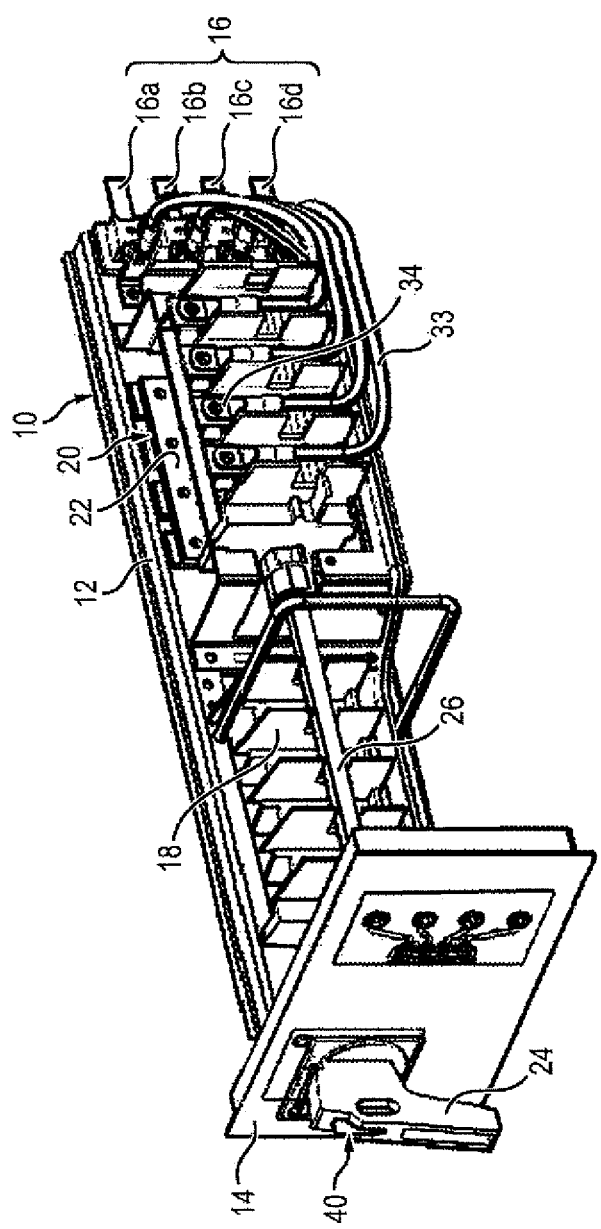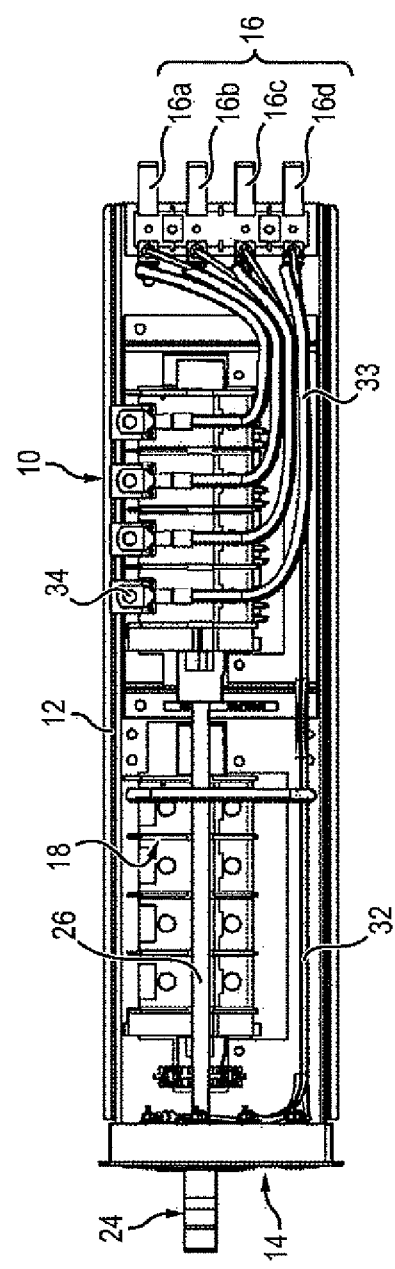
FIG. 1
FIG. 2

MAINTENANCE DRAWER FOR AN ELECTRICAL DISTRIBUTION SWITCHBOARD

CROSS-REFERENCE TO RELATED APPLICATIONS

The present application is a national phase entry under 35 U.S.C. § 371 of International Application No. PCT/FR2020/051105 filed Jun. 24, 2020, which claims priority from French Application No. 1906977 filed Jun. 26, 2019, all of which are incorporated herein by reference.

TECHNICAL FIELD

The present invention is concerned with the field of electrical distribution, and more precisely with a drawer adapted to be inserted into an electrical distribution board. This drawer is specially designed to enable an operator to carry out maintenance or measurement operations safely and readily.

TECHNOLOGICAL BACKGROUND

A lot of electrical pieces of equipment are present in an industrial facility. This electrical equipment, for example motors, transformers, pumps or other machines, has to be regularly monitored and maintained, and electrical measurements have to be carried out, especially to check that the equipment is functioning properly.

These operations are carried out, for example, directly on the equipment, which has been switched off and grounded (short-circuited) in order to protect operators working on the equipment from electrical risks. Prior grounding is done, for example, by connecting clamps to each lug of a terminal box of the equipment. Such an operation may be difficult to implement, for example due to a lack of accessibility to the equipment's electrical connections or a lack of space, and requires that the tools used, such as the connection clamps, are compatible with the equipment. Any failure to perform grounding can jeopardise the operator. In addition, there is a risk that someone, unaware of the maintenance, or by accident, may switch on the equipment again while an operator is working on it.

Monitoring operations can also be carried out on the electrical connection terminals of cables at the electrical distribution board, for example to carry out insulation or electrical continuity measurements. Connection tools, such as clamps, are then disposed on the live terminals, posing a major risk to the operator in the event of improper handling. The solution consisting of switching off the entire electrical distribution board has the drawback of de-energising all the pieces of equipment powered by this electrical distribution board, and can therefore only be carried out, for example, during scheduled maintenance shut-downs, thus preventing the necessary monitoring. This solution will therefore be avoided.

Furthermore, these different operations require mechanical handling, as for example unscrewing and screwing bolts holding the connection lugs in place, or disassembling and reassembling the protective covers. In the long term, such handling operations significantly increase the risk of damage, even though they are frequently carried out for maintenance purposes.

DISCLOSURE OF THE INVENTION

The purpose of the invention is to enable an operator to carry out maintenance or measurement operations safely and readily on electrical equipment in an industrial site.

To this end, a drawer is provided comprising:
a chassis adapted to enable insertion of the drawer into a location of the distribution switchboard,
a front panel closing the location of the distribution switchboard when the drawer is inserted into a distribution switchboard,
downstream connection terminals for connection to a load,
a plurality of connectors opening onto its front panel, each of these connectors being connected to a downstream connection terminal and enabling the connection of a measurement device,
wherein the drawer has a selector actuatable from the front panel, enabling the downstream connection terminals to be connected to and disconnected from an equipotential bonding.

The drawer according to the invention makes it possible to simplify, accelerate and secure performance of measurements and maintenance operations by an operator of an industrial site. The drawer is temporarily mounted (for the time of the measurements or the intervention) in place of the power supply drawer residing in the electrical distribution board, and enables measurements to be performed directly on the front panel of the drawer, and to be able to work being insulated from the upstream power supply from the electrical distribution board. The drawer then makes it possible to secure the equipment by short-circuiting and providing equipotential bonding to the connection terminals directly from the panel.

The drawer is advantageously completed by the following characteristics, taken alone or according to any technically possible combinations thereof:
the drawer is free of upstream connection terminals for connection to a power supply of the electrical distribution board;
the drawer has an insulating interface for facing the power bars of the electrical distribution board;
the selector is rotatable between a measurement position in which the downstream connection terminals are not connected to an equipotential bonding and a short-circuit position in which the downstream connection terminals are connected to the equipotential bonding;
the drawer further comprises a handle on the front panel, said handle being movable between a first position and a second position, the second position causing the drawer to be blocked in the distribution switchboard when the drawer is inserted into the distribution switchboard whereas in the first position the drawer is free from blocking in the distribution switchboard in order to enable its insertion or removal, the handle being mechanically connected to the selector so that rotation of the handle between the first position and the second position causes rotation of the selector between the measurement position and the short-circuit position, respectively;
the handle is provided with a member for locking rotation of said handle, configured to authorise or prohibit rotation of the handle;
the handle and the selector are rotatable about two distinct axes, and the handle is mechanically connected to the selector through at least one connecting rod;
the drawer comprises an electrically conductive short-circuiting member connectable to an equipotential bonding, and the selector comprises contact members connected to each downstream connection terminal and configured to contact the short-circuiting member by rotating the selector;

the panel comprises a main part mechanically connected to the chassis, and an extension fastened to a front panel side of the main part.

The invention also relates to a method for measuring electrical characteristics of a load connected to the downstream connection terminals of a drawer according to the invention, when said drawer is inserted into a location of an electrical distribution board, said method comprising the following steps of:

positioning the selector in a measurement position,
connecting a measurement device to at least two connectors of the front panel of the drawer,
performing measurements of electrical characteristics of the load,
wherein the downstream connection terminals comprise phase terminals and a ground terminal, a phase connector being connected to a phase terminal and a ground connector being connected to the ground terminal:
the measurement is a check for the absence of voltage, and the measuring apparatus is a voltmeter, or
the measurement is an insulation resistance measurement, both connectors are a phase connector and a ground connector, and the measuring apparatus is an insulation tester configured to apply a voltage across both connectors and to measure a current flowing between both connectors to deduce an insulation resistance therefrom, or
the measurement is an electrical continuity measurement, both connectors are two phase connectors, and the measurement device is an ammeter measuring a current flowing between the two phase connectors, or
the measurement is a cable search, the measuring apparatus is configured to inject into the connectors at least one measurement signal having a particular pattern, and a detector is used to identify cables of the load in which said measurement signal is passing.

The invention also relates to a method of a maintenance operation of equipment connected to the downstream connection terminals of a drawer according to the invention when said drawer is inserted into a location of an electrical distribution board, said method comprising the following steps of:

positioning the selector in a short-circuit position,
connecting a measurement device to at least two connectors of the front panel of the drawer,
checking for the absence of voltage,
performing the maintenance operation on the equipment.

The measurement method and/or the maintenance method may include a step of locking the positioning of the selector using a member for locking rotation of the handle mechanically connected to the selector.

BRIEF DESCRIPTION OF THE FIGURES

The invention will be better understood when considering the following description, which is concerned with a preferred exemplary embodiment, given by way of non-limiting example and explained with reference to the appended schematic drawings, among which:

FIG. 1 is a three-quarter front and elevation perspective overview of a drawer according to a possible embodiment of the invention;

FIG. 2 is a side view of a drawer according to a possible embodiment of the invention;

DETAILED DESCRIPTION

Figure 3:
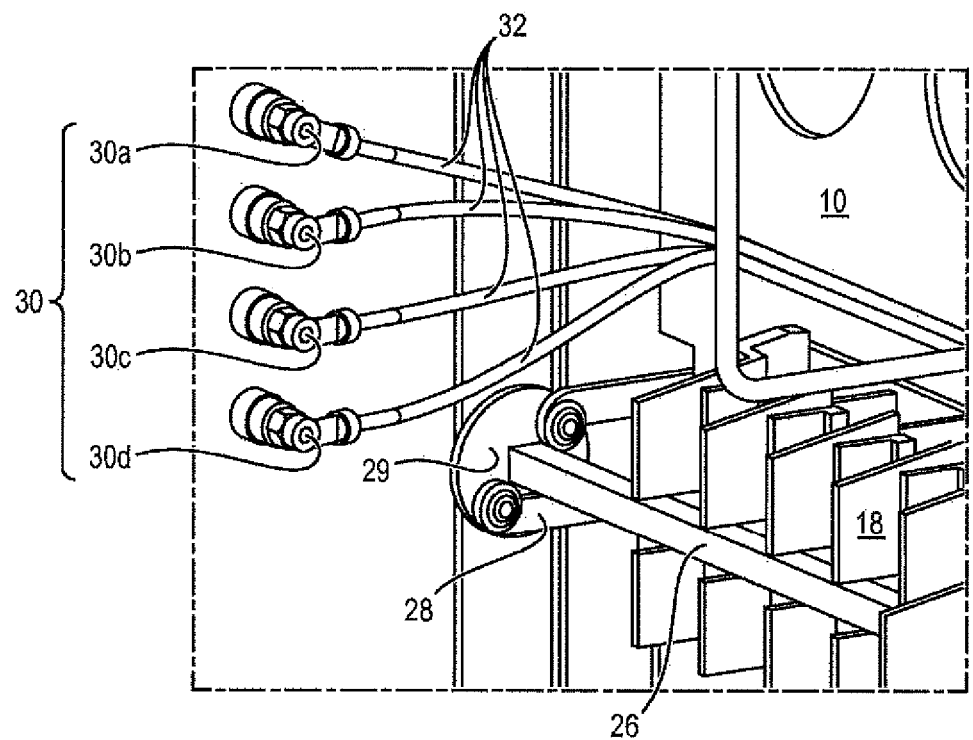
FIG. 3 is an enlarged view of a part rearwardly of the front panel of a drawer according to a possible embodiment of the invention.

An electrical distribution switchboard, also called a distribution board or a load centre, is an assembly including different types of switchgear associated with one or more incoming electric circuits, or loads, powered by one or more incoming electric circuits, as well as terminals for the neutral conductor and the protective conductor. In industrial applications, an electrical distribution board may take the form of a cabinet accommodating power drawers that are inserted into the cabinet at dedicated locations.

A conventional power drawer comprises a front panel closing the distribution switchboard, a metal chassis with a rail for insertion and removal of the power drawer, an upstream part comprising upstream connection terminals to the power supply, and a downstream part comprising downstream connection terminals to the load. The power drawer also accommodates electrical components such as relays, contactors or fuses, both in its downstream and upstream parts.

The invention provides a drawer configured to replace a conventional power drawer in a distribution switchboard in order to be able to perform measurements or maintenance operations on equipment connected to this switchboard.

With reference to FIGS. 1 and 2, a drawer according to one possible embodiment, described by way of illustrative example, comprises a chassis 10 adapted to enable insertion of the drawer into a location of a distribution switchboard. The chassis 10 is, for example, made of steel. The chassis 10 is inserted into runners of the location of the distribution switchboard. The chassis 10 may include a rail 12 to guide insertion or removal of the drawer from the electrical location of the distribution switchboard. The chassis 10 provides support for the other components of the drawer.

The drawer includes a front panel 14 which closes the location of the distribution switchboard when the drawer is inserted into a distribution switchboard. The size and shape of the drawer matches the shape and size of the conventional power drawer that it replaces in the electrical distribution board. Preferably, however, the front panel 14 is of a different colour from that of the conventional power drawers in order to be easily identifiable. For example, the front panel 14 may be green or red in colour when the power drawers are blue. Besides, the front panel 14 may be provided with a periphery that retains the ingress protection (or "IP") rating of the electrical distribution switchboard when the conventional power drawer is in place. The ingress protection rating of the switchboard is as defined in international standard IEC 60529. This may be, for example, but not limited to, an "Ingress Protection Rating 31"; the number '31' being comprised of two digits; the first digit '3' being concerned with the degree of protection against the penetration of solid foreign bodies larger than 12 nm, the second digit '1' being concerned with the degree of protection against the penetration of water in the form of falling water drops.

In order to maintain a similar tightness to that of the conventional power drawer it replaces, the front panel of the drawer should seal opening of the location of the distribution switchboard when the drawer is inserted into the distribution switchboard. The dimensions of the front panel 14 therefore have to correspond to the dimensions of this opening. But, the openings of the locations of the distribution switchboard may have different dimensions. Rather than providing drawers with as many sizes of front panel 14 as there are sizes of openings of locations of the distribution switchboard, the front panel 14 of the drawer can be comprised of several distinct parts secured by fasteners.

Figure 4:
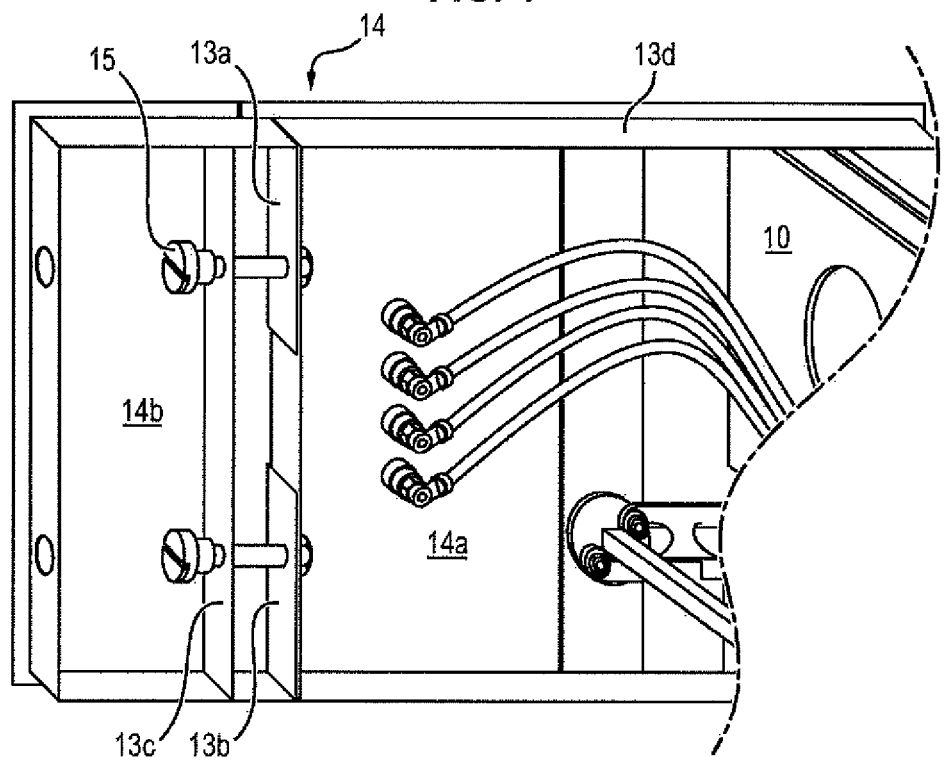
FIG. 4 is an enlarged view of a part rearwardly of the front panel of a drawer according to a possible embodiment of the invention in which the front panel comprises several parts.

With reference to FIG. 4, the front panel 14 can thus comprise a main part 14a mechanically connected to the chassis 10, and an extension 14b fastened to a front panel side of the main part 14a. The plurality of connectors, each connected to a downstream connection terminal, and the selector, which will be discussed below, open onto this main part 14a.

The extension 14b is fastened to the main part 14a through fasteners 15, which are here bolts. For this purpose, the main part 14a and the extension 14b may have holes configured to face each other after assembling the extension 14b to the main part 14a, to enable passage of the fasteners 15. The main part 14a and the extension 14b may have flanges 13a, 13b facing each other in which said holes are provided. An additional flange 13c may be provided on the inner face of the extension 14b, at a distance from the flange 13b of the extension 14b, and provided with holes enabling passage of the fasteners 15, for holding said fasteners 15. Other solutions may be contemplated for securing the parts of the front panel 14. The extension 14b could be sliding with respect to the main part 14a, with a slide blocking. By virtue of the extension, it is possible, from a drawer provided with a front panel 14 having the most common dimensions (i.e. those of the main part 14a), to modify this front panel 14 with the extension 14b to adapt it to locations with openings of larger dimensions, in a simple and less costly manner than being forced to provide drawers specifically dedicated to some particular dimensions.

Besides, in order to maintain the ingress protection rating, the drawer can be configured to tightly close the opening of the location of the distribution switchboard, by cooperating with a tightness element such as a seal. The tightness element may be present on the periphery of the opening of the location of the distribution switchboard, and the front panel 14 of the drawer may then comprise, typically on the periphery of its inner face, a space for receiving this tightness element. This receiving space may for example be defined by a peripheral flange 13d on the inner face of the panel 14 protruding inwardly of the drawer at a distance from the inner face edge of the panel 14, clearing the receiving space for the tightness element which will then be compressed between the periphery of the inner face of the front panel 14 and the flange 13d. It is to be noted that this flange 13d can act as a flange 13a for fastening the extension 14b.

The drawer also includes downstream connection terminals 16 for connection to a load. Typically, and as in the example illustrated, the downstream connection terminals 16 take the form of knives, that is flat pins, intended to be inserted into receptacles of a terminal block of the electrical distribution board to be electrically connected, via a cable-type electrical bond, to equipment forming an electrical load, such as a motor or a transformer. There is one downstream connection terminal 16 for each phase of the electrical connection, and one downstream connection terminal 16 for the ground, also called ground or equipotential bonding. Typically, an industrial facility uses a power supply with three phases, hence there are four connection terminals 16 in the example illustrated, with a ground terminal 16a, and three phase connection terminals 16b, 16c, 16d.

Unlike a conventional power drawer, the drawer is free of upstream connection terminals for connection to a power supply of the electrical distribution board. Instead, the drawer has an insulating interface 18 for facing the power bars of the electrical distribution board in order to insulate the drawer from the power bars, thereby making sure of the absence of power supplies to the downstream connection terminals 16.

The drawer further includes a selector 20 actuatable from the panel 14 and enabling the downstream connection terminals 16 to be connected to and disconnected from an equipotential bonding. The selector 20 is a mechanical member for selecting one operating mode or another operating mode of the drawer by modifying configuration of the drawer. The selector 20 may, for example, be a switch or a disconnector.

More precisely, the drawer comprises an electrically conductive short-circuiting member 22 connected to an equipotential bonding, and the selector 20 is rotatable between a measurement position in which the downstream connection terminals 16 are not connected to the equipotential bonding and a short-circuit position in which the downstream connection terminals 16 are connected, via the short-circuiting member 22, to the equipotential bonding.

For this purpose, the drawer comprises a handle 24 on the panel 14, rotatably movable between at least a first position and a second position. The handle 24 is located on the face of the panel 14 opposite to the chassis 10, so that the handle 24 is accessible from outside the electrical distribution board when the drawer is inserted into the distribution switchboard. In FIG. 1, the handle 24 is in a first vertical position, whereas in FIG. 2, the handle 24 is in a second vertical position. It is of course possible to provide more than two positions for the handle 24.

The selector 20 may comprise a shank 26 extending from the panel 14 to contact members of the drawer, connected to each connection terminal 16 and configured to contact the short-circuiting member 22 by rotating the selector 20. More precisely, rotation of the handle 24 causes rotation of the shank 26, which causes rotation of the contact members. As represented in FIG. 3, it is possible that the handle 24 and the selector 20 (or more precisely the shank 26) are not aligned, and are therefore rotatable about two distinct axes. The handle 24 may then be mechanically connected to the selector 20 through at least one connecting rod 28. In the example, the part of the handle 24 passing through the panel 14 is connected to two connecting rods 28 extending along the internal face of the front panel 14. These connecting rods 28 are connected to a piece 29 eccentrically with respect to an axis about which this piece 29 rotates, the shank 26 being integral with this rotatable piece 29.

The distribution drawer has a plurality of connectors 30 opening onto its front face, each of these connectors 30 being connected to a downstream connection terminal 16. There are thus a ground connector 30a connected to the ground terminal 16a, and three phase connectors 30b, 30c, 30d each connected to a phase terminal 16b, 16c, 16d. The connectors 30 pass through the panel 14 so that the connectors 30 are accessible from outside the electrical distribution board when the drawer is inserted into the distribution switchboard, while being connected to the connection terminals 16 therein. The connectors 30 enable connection of a measurement device. The connectors are female connectors, for example of the 4 mm type, and may for example be insulated safety sockets commonly referred to as banana connectors which can accommodate male banana plugs. In a simple manner, connection between the connectors 30 and the downstream connection terminal 16 can be made by wires 32 directly connecting each connector 30 to its connection terminal 16, as in the example illustrated. It is also possible to provide wires connecting each connector 30 to a conductive element such as the lugs 34 connected to its connection terminal 16.

Figure 5:
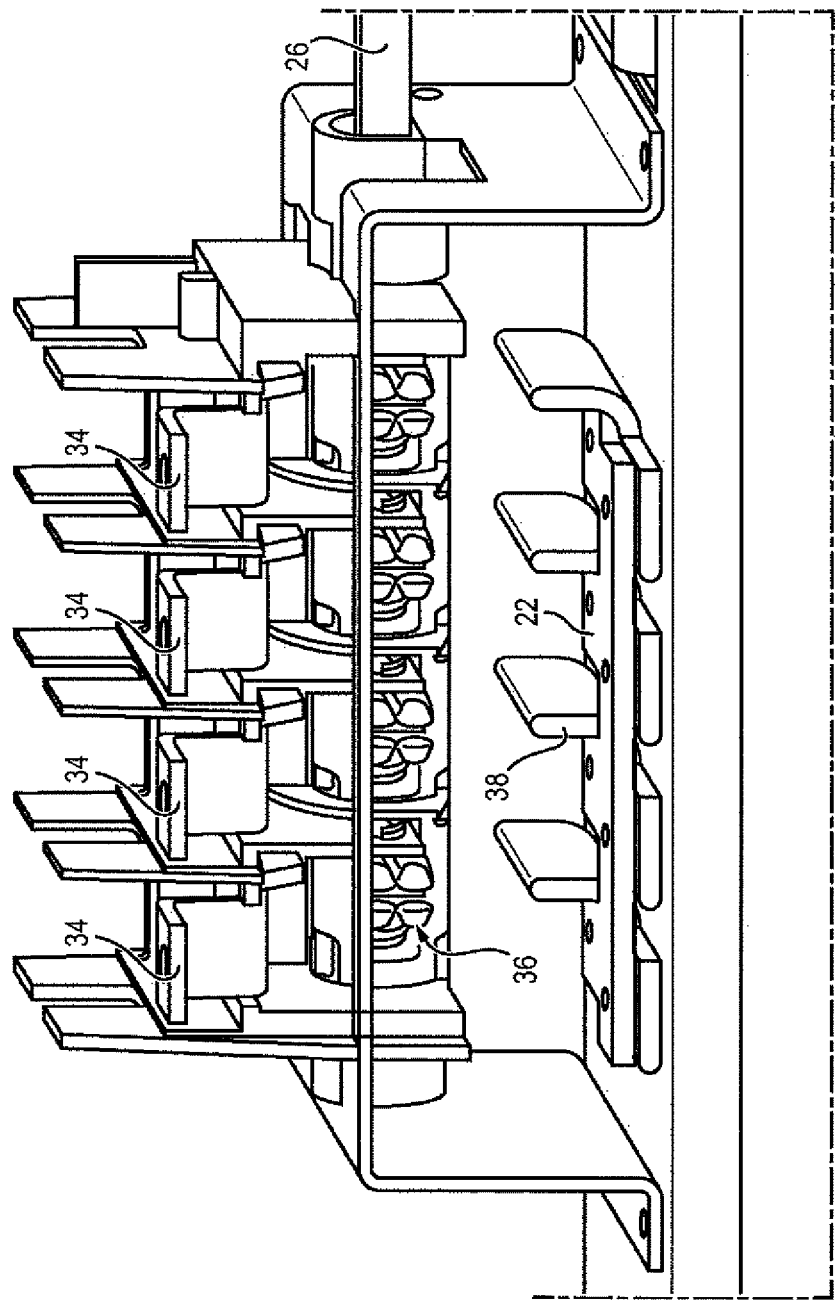
FIG. 5 is a close-up view of the downstream section of a drawer according to a possible embodiment of the invention, showing the selector in the connection position.
Figure 6:
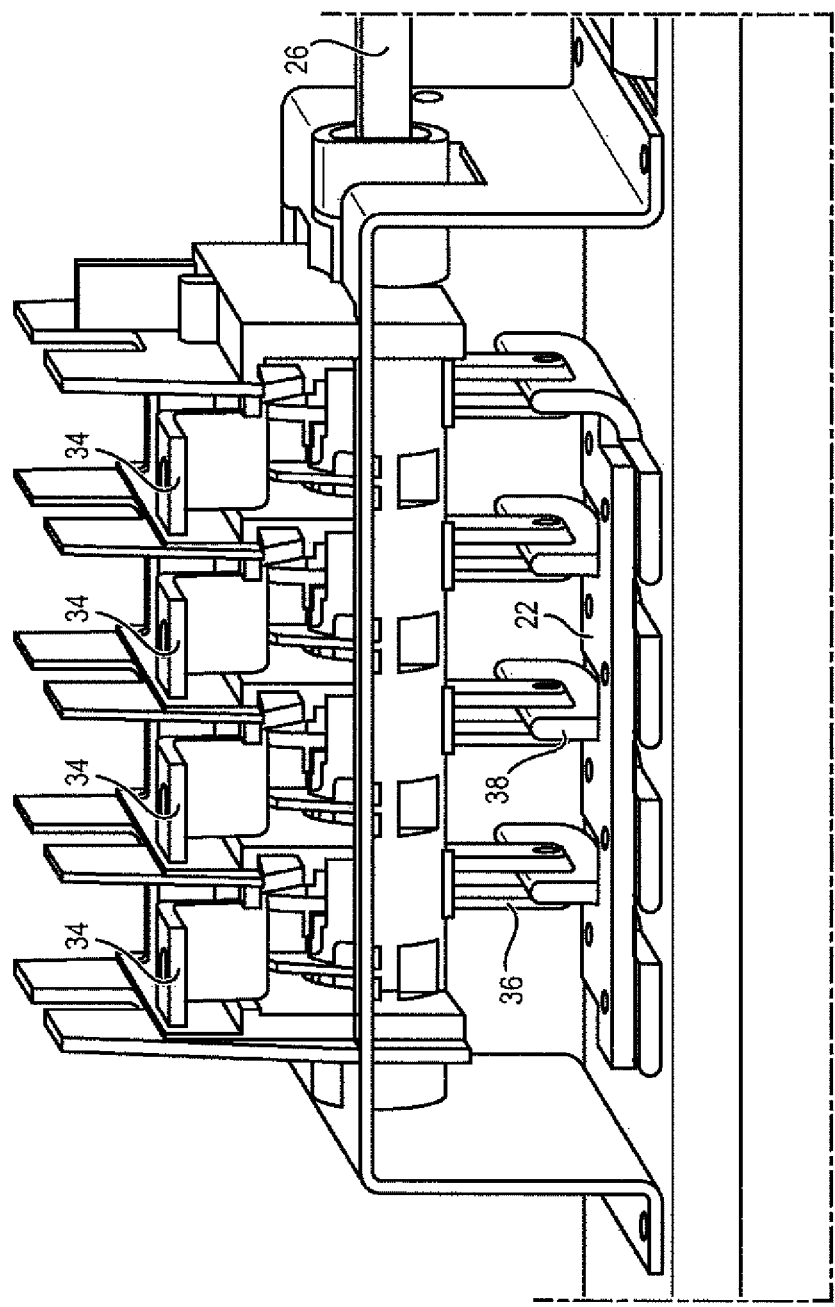
FIG. 6 is a close-up view of the downstream section of a drawer according to a possible embodiment of the invention, showing the selector in the safety position.

In FIGS. 5 and 6, the wires 32 directly connecting each connector 30 to its connection terminal 16 and the wires 33 connecting the connection terminals 16 to lugs 34 electrically connected to the selector 20 are not represented for clarity purposes. The lugs 34 are electrically connected to the contact members 36 of the selector 20 which are rotatable. In FIG. 5, the selector 20 is in the measurement position, which corresponds for example to the first position of the handle 24, that is in the horizontal position in the examples illustrated. The contact members 36 of the selector 20 are raised, and are not in contact with the short-circuiting member 22. The downstream connection terminals 16 are not connected to the equipotential bonding.

In this position, the downstream connection terminals 16 are not short-circuited. It is therefore possible to perform measurement of electrical characteristics of the equipment (for example motor or transformer) connected to the downstream terminals 16 of the load-forming drawer. It is sufficient to connect a measurement device to at least two connectors 30 on the front panel 14 of the drawer, in order to carry out measurements. For example, the measurement may be a check for the absence of voltage, and the measurement device is a voltmeter, thereby connected to the ground connector 30a and successively to the different phase connectors 30b, 30c, 30d.

The measurement may also be an insulation resistance measurement. Both connectors to which the measurement device is connected are a phase connector 30b, 30c, 30d and the ground connector 30a. The measuring apparatus is an insulation tester configured to apply voltage across both connectors 30 and to measure current flowing between both connectors 30 to deduce an insulation resistance therefrom.

The measurement may also be an electrical continuity measurement, both connectors are two phase connectors 30b, 30c, 30d, and the measurement device is an ammeter measuring current flowing between the two phase connectors 30b, 30c, 30d.

The measurement may also be a cable search, the measurement device is then configured to inject at least one measurement signal having a particular pattern into the connectors 30. A detector is then used to identify cables of the load in which said measurement signal is passing. The injected pattern may correspond to a voltage or intensity variable signal, likely to generate an electromagnetic signal in the vicinity of the cables concerned in which said measurement signal is passing, and the detector may remotely detect this electromagnetic signal.

In FIG. 6, as a result of pivoting of the handle 24 into its second position, rotation of the shank 26 has caused rotation of the contact members 36 of the selector 20, which by pivoting have contacted the short-circuiting member 22. The selector 20 is then positioned in a short-circuit position.

For example, the short-circuiting member 22 may have protruding parts 38 (one per phase and for ground) and the contact members 36 may have a U-shape whose legs come to lie on either side of the protruding parts 38, so as to sandwich these protruding portions 38 to make electrical contact between the short-circuiting member 22 and the contact members 36 of the selector 20 which are in electrical connection with the connecting terminals 16. The protruding parts 38 of the short-circuiting member 22 are electrically connected to each other, and the downstream connection terminals 16 are thus short-circuited to each other. Because the ground terminal 16a is now connected to the three phase connection terminals 16b, 16c, 16d, the downstream connection terminals 16 are then grounded, that is to an equipotential bonding. Preferably, the short-circuiting member 22 is also grounded, for example through its contact with the chassis 10. The short-circuiting member 22 is made, including its protruding parts 38, of an electrically conductive material.

Once the downstream connection terminals 16 are connected to an equipotential bonding and short-circuited, it is possible for an operator to safely carry out a maintenance operation on equipment connected to the downstream connection terminals 16 of the drawer. The operator can check for an absence of voltage by connecting a measurement device such as a voltmeter to at least two connectors 30 of the front panel 14 of the drawer, and then perform the maintenance operation on the equipment.

Figure 7:
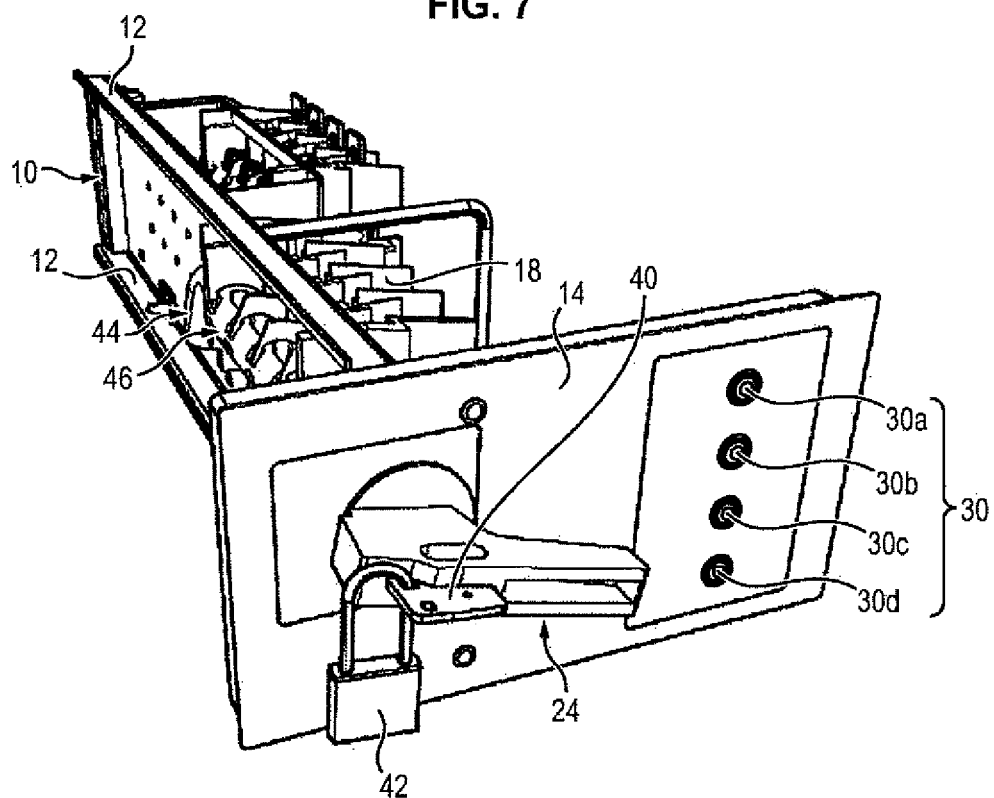
FIG. 7 is a three-quarter view of a drawer according to a possible embodiment of the invention, showing the handle horizontally locked with the blocking member inactive.
Figure 8:
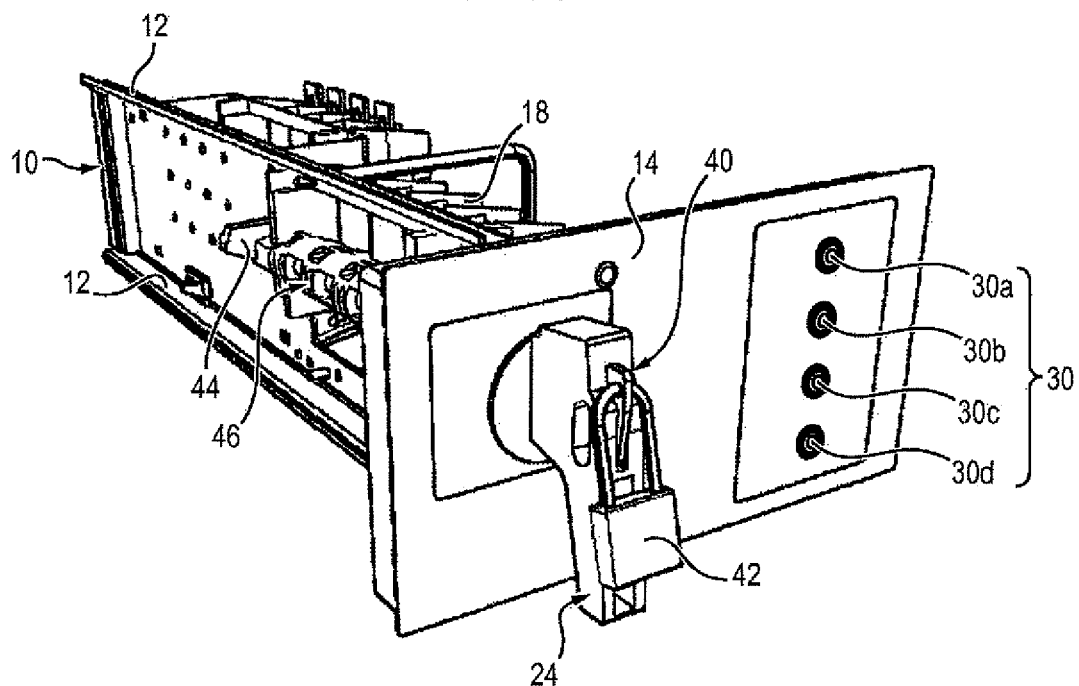
FIG. 8 is a three-quarter front view of a drawer according to a possible embodiment of the invention, showing the handle vertically locked with the locking member active.

It is preferable that the state of the drawer cannot be accidentally modified during measurements or maintenance operations. It is therefore possible to lock positioning of the selector 20 by using a member 40 for locking rotation of the handle 24 mechanically connected to the selector 20, as illustrated in FIGS. 7 and 8. The locking member may take the form of a metal tab 40, the depression of which is necessary to authorise rotation of the handle 24. This metal tab 40, when protruding from the handle 24, has one or more holes for inserting one or more padlocks 42 respectively therein, prohibiting depression of the tab 40 and thus rotation of the handle 24.

In addition, to ensure safety of the operator, the drawer is lockable in the distribution switchboard to prohibit any accidental removal. This blocking is done by means of the handle 24. As discussed, the handle 24 is movable between a first position and a second position, the second position blocking the drawer in the distribution switchboard when the drawer is inserted into the distribution switchboard, whereas in the first position the drawer is free from blocking in the distribution switchboard in order to enable its insertion or removal. For this purpose, the drawer comprises at least one member for blocking the drawer in the distribution switchboard, actuatable by the handle 24.

FIG. 7 thus shows an example of a drawer with the handle 24 in the first position, here the horizontal position, locked by a padlock 42 passing through the hole of the tab 40. The blocking member comprises at least one blocking arm 44 integral with the rotation of the handle 24, which is extended along the chassis 10 via a shaft to which the blocking arm 44 is mounted. In FIG. 7, the blocking arm 44 is raised, not extending beyond the rails 12, and enabling the drawer to be inserted. Similarly, fingers 46 are mounted to the shaft and are raised.

FIG. 8 shows an example of a drawer with the handle 24 in the second position, here the vertical position, locked by a padlock 42 passing through the hole in the tab 40. The blocking arm 44, which has pivoted with the handle, now protrudes beyond the plane defined between the two rails 12, and by cooperation with the frame of the electrical distribution board, opposes to the removal of the drawer. The fingers 46 have also pivoted, and now engage with the distribution switchboard power bars (not represented). The fingers 46, and preferably the blocking arm 44, are made of an insulating material such as plastic, enabling the drawer to be electrically insulated from the power bars as well as rigidifying hold of the drawer in its location. Similarly, the interface 18 is insulating and further insulates the drawer from the busbars, thus making sure that there is no power supply to the downstream connection terminals 16. Further, the assembly 18 may provide guide for the shank 26.

The invention is not limited to the embodiment described and represented in the appended figures. Modifications remain possible, especially in terms of constitution of the various elements or by substitution of technical equivalents, without however departing from the field of protection of the invention.

The invention claimed is:

1. A drawer comprising:
    a chassis adapted to enable insertion of the drawer in a location of an electrical distribution switchboard,
    a front panel closing the location of the electrical distribution switchboard when the drawer is inserted into the electrical distribution switchboard,
    downstream connection terminals for connection to a load, and
    a plurality of connectors opening onto the front panel, each of the connectors being connected to a respective one of the downstream connection terminals and enabling connection of a measurement device,
    wherein the drawer has a selector actuatable from the front panel, and enabling the downstream connection terminals to be connected to and disconnected from an equipotential bonding, wherein the selector is rotatable between a measurement position in which the downstream connection terminals are not connected to the equipotential bonding and a short-circuit position in which the downstream connection terminals are connected to the equipotential bonding.

2. The drawer according to claim 1, wherein the drawer is devoid of upstream connection terminals configured to be connected to a power supply of the electrical distribution board.

3. The drawer according to claim 2, having an insulating interface for facing power bars of the electrical distribution board.

4. The drawer according to claim 1, further comprising a handle on the front panel, said handle being movable between a first position and a second position, the second position causing the drawer to be blocked in the electrical distribution switchboard when the drawer is inserted into the electrical distribution switchboard whereas in the first position the drawer is free from blocking in the electrical distribution switchboard in order to enable insertion or removal of the drawer, the handle being mechanically connected to the selector so that rotation of the handle between the first position and the second position causes rotation of the selector between the measurement position and the short circuit position, respectively.

5. The drawer according to claim 4, wherein the handle is provided with a member for locking the rotation of said handle configured to authorise or prohibit the rotation of the handle.

6. The drawer according to claim 4, wherein the handle and the selector are rotatable about two distinct axes, and the handle is mechanically connected to the selector by at least one connecting rod.

7. The drawer according to claim 1, wherein the drawer comprises an electrically conductive short-circuiting member connectable to the equipotential bonding, and the selector comprises contact members connected to each of the downstream connection terminals and configured to contact the short-circuiting member by rotating the selector.

8. The drawer according to claim 1, wherein the front panel comprises a main part mechanically connected to the chassis, and an extension fastened to a panel side of the main part.

9. A method for measuring electrical characteristics of a load connected to the downstream connection terminals of the drawer according to claim 1, when said drawer is inserted into the location of the electrical distribution board, said method comprising steps of:
    positioning the selector in a measurement position in which the downstream connection terminals are connected to the equipotential bonding,
    connecting a measurement device to at least two connectors of the front panel of the drawer, and
    performing a measurements of electrical characteristics of the load, wherein the downstream connection terminals comprise phase terminals and a ground terminal, the plurality of connectors comprise a plurality of phase connectors, each of the phase connectors being connected to a respective one of the phase terminals, and a ground connector being connected to the ground terminal, and wherein:
    the measurement is a check for an absence of voltage, the at least two connectors are a phase connector of the phase connectors and a ground connector, and the measurement device is a voltmeter configured to check for the absence of voltage between the phase connector and the ground connector, or
    the measurement is an insulation resistance measurement, the at least two connectors are a phase connector of the phase connectors and a ground connector, and the measuring apparatus is an insulation tester configured to apply voltage across the phase connector and the ground connector and to measure current flowing between the phase connector and the ground connector to deduce an insulation resistance therefrom, or
    the measurement is an electrical continuity measurement, the at least two connectors are two of the phase connectors, and the measurement device is an ammeter configured to measure current flowing between the two of the phase connectors, or
    the measurement is a cable search, the measuring apparatus is configured to inject at least one measurement signal having a particular pattern into the connectors, and a detector is used to identify cables of the load in which said measurement signal is passing.

10. The method according to claim 9, further comprising a step of locking the measurement position of the selector using a member for locking rotation of the handle mechanically connected to the selector.

11. A method of a maintenance operation of equipment connected to the downstream connection terminals of the drawer according to claim 1 when said drawer is inserted into the location of the electrical distribution board, said method comprising steps of:

positioning the selector in a short-circuit position in which the downstream connection terminals are connected to the equipotential bonding, connecting a measurement device to at least two connectors of the front panel of the drawer, checking for an absence of voltage, and performing the maintenance operation on the equipment.

12. The method according to claim 11, further comprising a step of locking the short-circuit position of the selector using a member for locking rotation of the handle mechanically connected to the selector.

* * * * *